United States Patent
Rehm et al.

[11] Patent Number: 5,677,642
[45] Date of Patent: Oct. 14, 1997

[54] SIGNAL GENERATOR WITH SUPPLY VOLTAGE TOLERANCE

[75] Inventors: Dennis J. Rehm; Phillip A. Callahan, both of Fort Collins, Colo.

[73] Assignees: AT&T Global Information Solutions Company, Dayton, Ohio; Hyundai Electronics America, San Jose, Calif.; Symbios Logic Inc., Fort Collins, Colo.

[21] Appl. No.: 333,014

[22] Filed: Nov. 1, 1994

[51] Int. Cl.$^6$ .................................................. H03K 19/08
[52] U.S. Cl. ........................... 327/65; 327/110; 327/170; 327/321; 327/322; 327/380
[58] Field of Search ........................... 327/65, 110, 380, 327/321, 322, 170

[56] References Cited

U.S. PATENT DOCUMENTS

| | | | |
|---|---|---|---|
| 4,965,469 | 10/1990 | Kondoh et al. | 307/446 |
| 4,978,905 | 12/1990 | Hoff et al. | 323/314 |
| 5,103,157 | 4/1992 | Wright | 323/275 |
| 5,280,202 | 1/1994 | Chan et al. | 307/243 |
| 5,304,952 | 4/1994 | Quiet et al. | 331/1 A |
| 5,309,036 | 5/1994 | Yang et al. | 327/110 |
| 5,311,084 | 5/1994 | Gabara | 327/170 |
| 5,331,295 | 7/1994 | Velinek et al. | 331/57 |
| 5,367,201 | 11/1994 | Hedberg | 327/543 |
| 5,377,094 | 12/1994 | Williams et al. | 327/110 |
| 5,382,921 | 1/1995 | Estrada et al. | 331/1 A |
| 5,394,037 | 2/1995 | Josephson et al. | 327/544 |
| 5,434,525 | 7/1995 | Leonowich | 327/278 |
| 5,498,992 | 3/1996 | Lai et al. | 327/336 |

FOREIGN PATENT DOCUMENTS

0652641  11/1993  European Pat. Off. ..... H03K 19/003

OTHER PUBLICATIONS

A High–Performance GaAs Pin Electronics Circuit for Automatic Test Equipment; S. S. Taylor; IEEE Journal of Solid-State Circuits, vol. 28, No. 10; Oct. 1993; pp. 1023–1029.

*Primary Examiner*—Margaret Rose Wambach
*Attorney, Agent, or Firm*—Wayne P. Bailey

[57] ABSTRACT

A signal generator and method that is tolerable to supply voltage fluctuations and differentials. A current switch is driven that is independent of the supply voltage. By clamping the slewing voltage at the gate of a transistor driver, the difference between the clamped gate voltage and the threshold turn on voltage of the driver will be constant with respect to the supply voltage. This will cause the transition edges of the driver's output voltage to be constant with respect to the supply voltage. This technique minimizes variations in the output signal edge transitions as the supply voltage varies over various tolerance ranges. Because this technique increases the control of the transition edges in the output signal, it is possible to generate much slower edges and still maintain a consistent transition voltage shape with variations in the supply voltage and the symbol width.

20 Claims, 8 Drawing Sheets

14

SIGNAL GENERATOR WITH SUPPLY VOLTAGE TOLERANCE

TECHNICAL FIELD

The present invention relates to a signal generator, and more specifically to a high-speed signal generator which maintains acceptable signal waveforms notwithstanding supply voltage fluctuations.

BACKGROUND OF THE INVENTION

When an analog waveform representing a digitally encoded data signal is generated, one usually wishes to generate specific amplitudes with a defined shape to the signal when it transitions from one amplitude to another. When the data rate is at or above 10 Mbits/sec it becomes more difficult to produce the desired transition shape. Variations in the supply voltage will usually cause unwelcome changes to the signal transition shape.

Such problems are becoming more acute with the advent of new high-speed communication protocols such as Fast Ethernet and Fast SCSI. For such protocols, where signal switching speeds greater than 10 Mbits/sec are required, there is a need to maintain accurate signaling waveforms even when supply voltages fluctuate between established tolerance values.

The advent of high speed switching of data signals has also resulted in requirements for tightly controlling the slew rate of data signals being transmitted on a communication interface/channel. These slew rate requirements are meant to reduce the amount of noise generated by signals that have fast rise and fall times. There is a need to maintain signal waveforms having relatively slow slew rates and that are symmetrical notwithstanding fluctuations in either the supply voltage or the symbol width of data to be transmitted.

It is therefore an object of the present invention to provide an improved signal generator.

It is another object of the present invention to provide an improved signal generator which is tolerant to voltage supply fluctuations.

It is another object of the present invention to provide a signal generator for use in high-speed data communications.

It is another object of the present invention to provide a signal generator which provides a symmetrical slew rate that is independent of supply voltage.

It is another object of the present invention to provide a signal generator which provides a symmetrical slew rate that is independent of signal symbol width.

It is another object of the present invention to provide a driver circuit that operates at a plurality of supply voltages while maintaining an acceptable slew rate.

SUMMARY OF THE INVENTION

The present invention is a signal generator that is tolerable to supply voltage fluctuations and differentials. A current switch is driven in a way that is independent of the supply voltage. In most applications, the current will be flowing through a specific load (e.g. impedance), and thus an output voltage will be developed. The use of the technique described herein will cause the change in output voltage to occur much more precisely as a function of time. Specifically, a current starved inverter drives into the gate of a driver transistor, and the resulting voltage ramp on the gate is clamped so that the difference between the clamped gate voltage and the threshold turn-on voltage of the driver transistor will be constant with respect to the supply voltage. This technique minimizes variations in the output signal edge transitions as the supply voltage varies over the typical 5 or 10% tolerance range. However, the robustness of this technique has been shown to work in a circuit which has its supply voltage vary from 3.0 to 7.0 volts. Because this technique increases the control of the transition edges in the output signal, it is possible to generate much slower edges and still maintain a consistent transition voltage shape with variations in the supply voltage and the symbol width.

Applications for this technique include the generation of differential data signals where it is important that the differential signals have slow transition edges and are very symmetric. These two criteria are very important in reducing the radiated emissions from the cable which is carrying the data signal. This technique can also be used when many differential current switches are summed together and the switches are turned on sequentially in order to generate transition edges which are piece-wise approximations to a sine wave. Using this approach, the piece-wise approximations achieves improved linearity.

DETAILED DESCRIPTION OF THE PREFERRED EMBODIMENT

The following technique minimizes variations in the output signal edge transitions as the supply voltage varies over the typical 5 or 10% tolerance range. However, the robustness of this technique has been shown to work in a circuit which has its supply voltage vary from 3.0 to 7.0 volts. As used herein, substantially dissimilar voltages encompass voltages that are not within a typical tolerance range of 10%. For example, a nominal voltage of 5.0 volts and a 10% tolerance would have an acceptable tolerance range of 4.5 volts to 5.5 volts. Voltages less than 4.5 volts and greater than 5.5 volts would therefore be substantially dissimilar to 5.0 volts. For a nominal voltage of 3.3 volts, voltages less than 2.97 volts and greater than 3.63 volts are substantially dissimilar to 3.3 volts.

Figure 1:
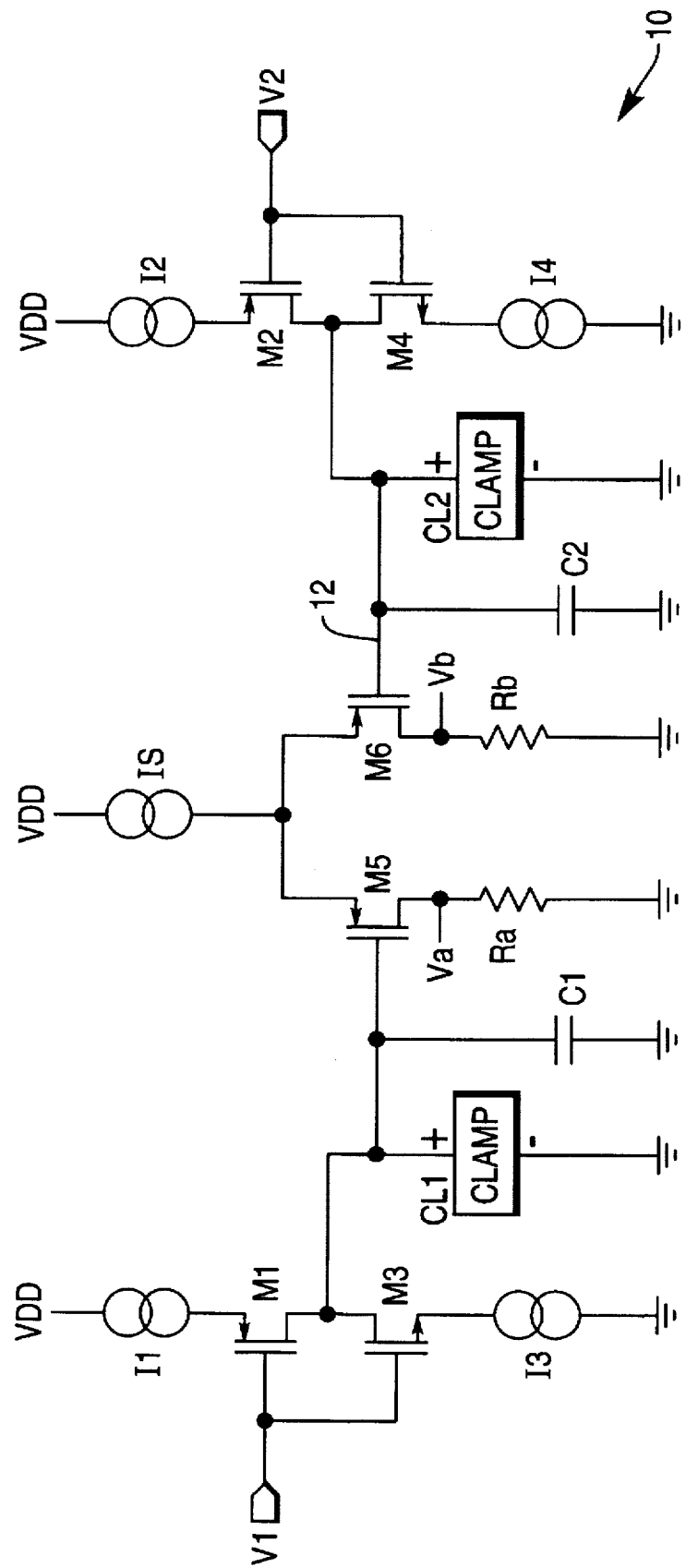
FIG. 1 shows an improved signal generator.
Figure 2:
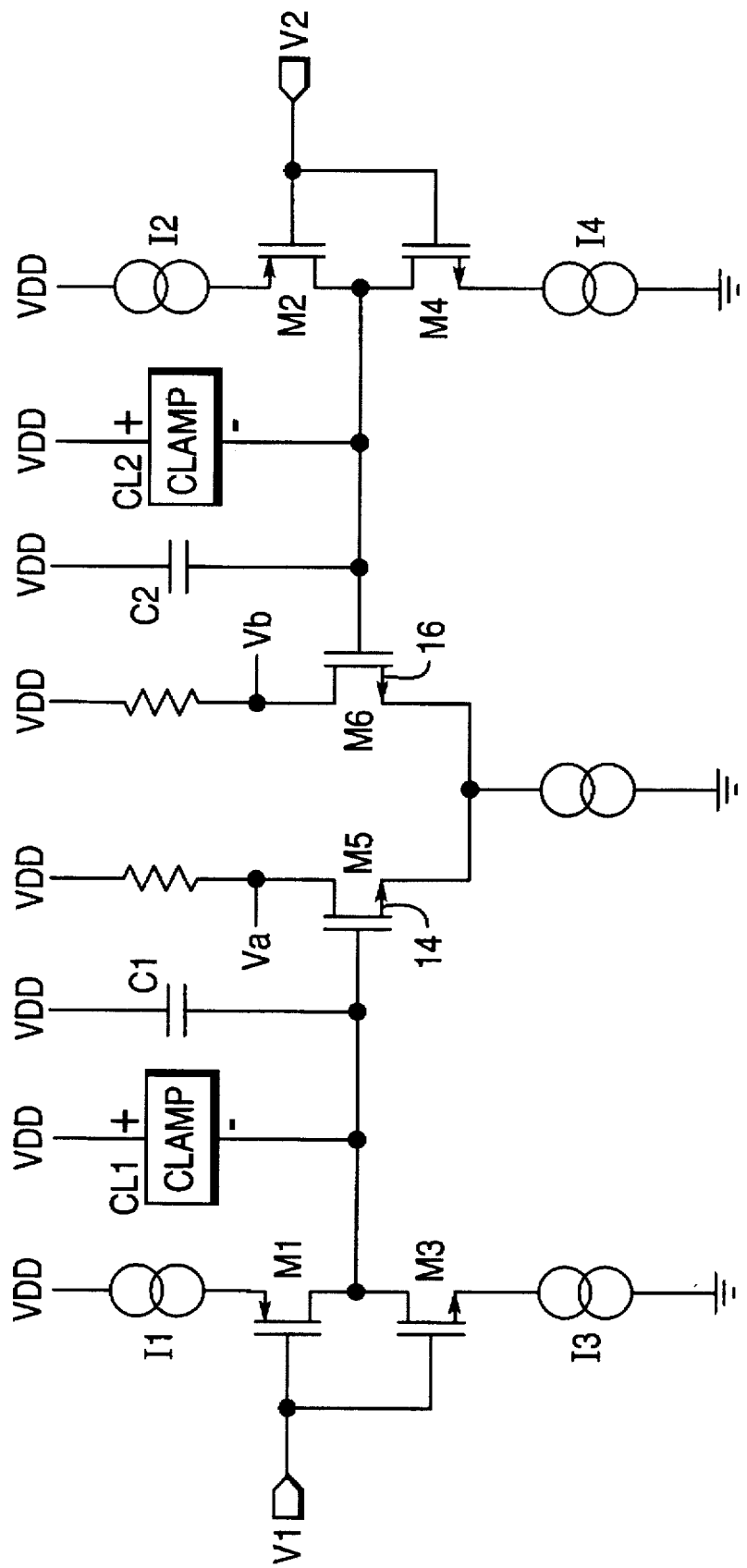
FIG. 2 shows a second embodiment of an improved signal generator.
Figure 3:
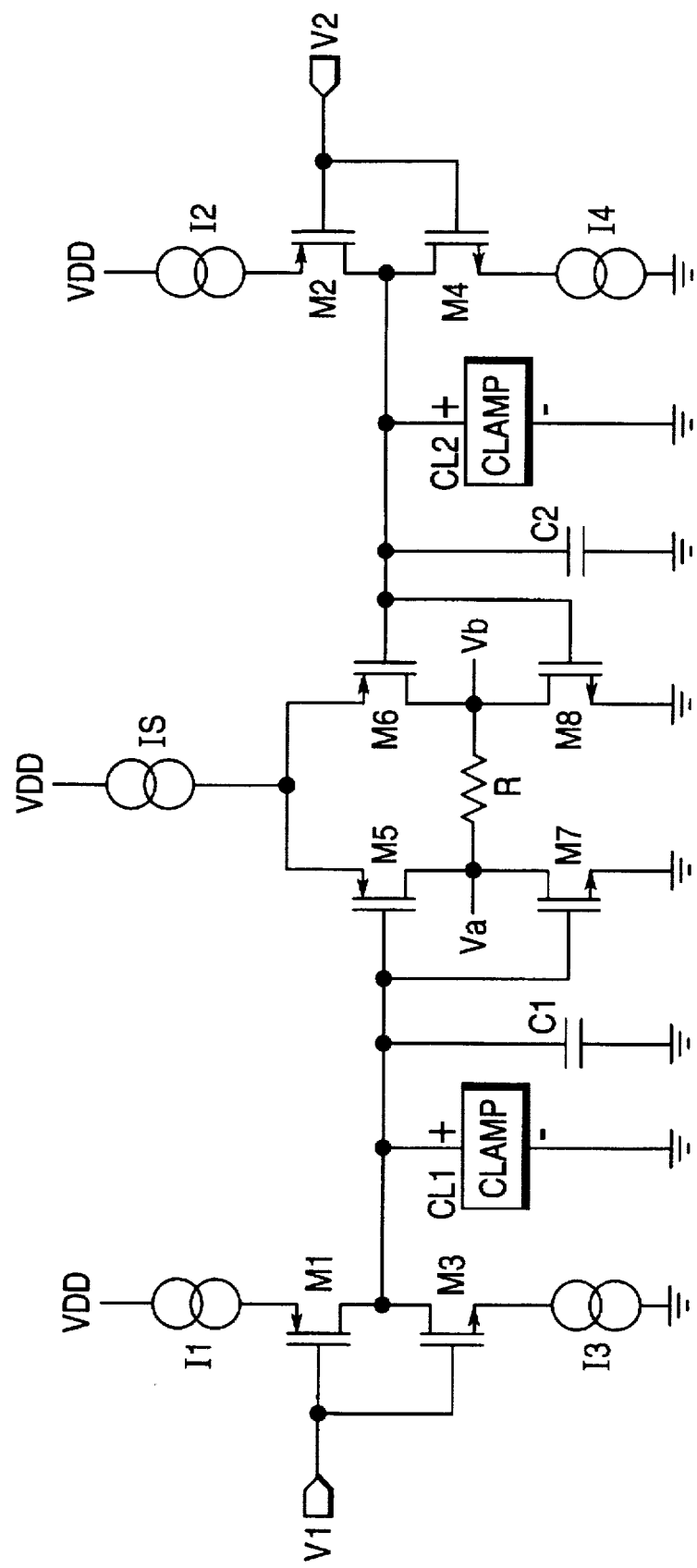
FIG. 3 shows a third embodiment of an improved signal generator.
Figure 4:
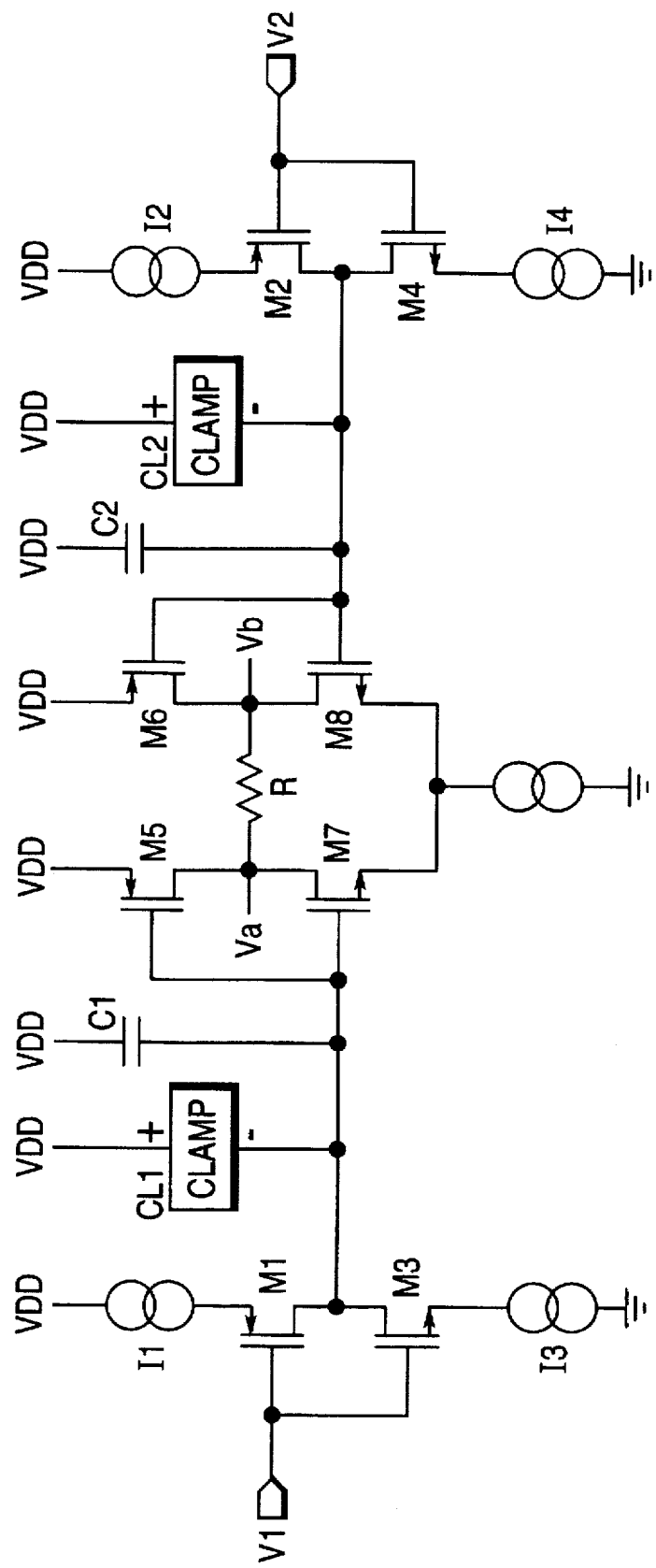
FIG. 4 shows a fourth embodiment of an improved signal generator.

FIG. 1 shows the preferred embodiment of the present invention. However, other similar embodiments such as those shown in FIGS. 2–4 are also possible. Continuing with FIG. 1, transistors M1, M2, M3 and M4 perform as switches which enable currents I1, I2, I3 and I4, respectively, to flow. These currents are provided by typical current sources known in the art, and accordingly need not be further described herein to understand the present invention. The configuration of transistors M1–M4, in combination with current sources I1–I4, is typically known in the art as a current-starved inverter. Input signals V1 and V2 are differential data signals which swing between supply voltages VDD and VSS/ground with very fast rise and fall times. Transistors M5 and M6 are output driver transistors that generate, respectively, output signals Va and Vb. Driver transistors M5 and M6 are current switches which selectively enable current from current source Is to flow. The gates of transistors M5 and M6 are coupled to the outputs of transistor pairs M1/M3 and M2/M4, respectively. Clamps CL1 and CL2 are also coupled to the respective gates of M5 and M6. Capacitors C1 and C2 represent the total capacitance at these nodes, which may be the sum of all active device capacitance as well as any discrete, externally or internally added, capacitance. Output signals Va and Vb are differential output signals that may drive a communication or device interface/channel (not shown) such as Ethernet or SCSI. Resistors Ra and Rb may be used to match the output impedance of the signal generator 10 with the impedance of the communication interface/channel.

I will initially describe the DC (i.e. steady state) characteristics for the circuit of FIG. 1. When input V1 is high (i.e. a logical one) and input V2 is low (i.e. a logical zero), starved inverter transistors M2 and M3 are on and M1 and M4 are off. In addition, transistor driver M5 is on, and M6 is off. This causes all of current Is to flow through Ra producing a high voltage level at output Va. Since M2 is on, the current I2 is flowing into clamp CL2 which limits the voltage present at the gate of M6 (i.e. the M6 gate voltage is clamped such that it cannot exceed some threshold or clamped value). If I2 is constant with respect to VDD (relatively easy to accomplish using standard techniques commonly known in the art), then the voltage at the gate of M6 will be constant with respect to VDD. By using one or more transistors inside the clamp, and by varying their size and type, one can set the clamp voltage at the gate input 12 of M6 over a wide range. For the clamps described herein (later described with respect to FIG. 5), the clamp voltage is a function of the input current and the process and device parameters used. The preferred clamp voltage is approximately 1.9 volts. If the clamp were not present, then the voltage at the gate input of M6 would eventually charge to VDD, which would obviously not be constant with respect to VDD.

Next I will describe the AC characteristics of the circuit shown in FIG. 1. These AC characteristics come into play as input voltages V1 and V2 change. The following discussion focuses on input V2 changing from low to high (and input V1 changing from high to low, since V1 and V2 are differential data signals). The right side of the circuit in FIG. 1 will be described in detail, with similar effects on the left hand side of this circuit shown in parenthesis.

Because of the finite speed at which the voltage on the gate of M6 (or M5) can change, the turn on time for M6 (M5) is a function of the difference between the high voltage on the gate of M6 (M5) and the threshold turn on voltage for M6 (M5). By clamping the high voltage at the gate of M6 (M5), the difference between the clamped gate voltage and the threshold turn on voltage of M6 (M5) will be constant with respect to VDD. This will cause the transition edges of the voltage Vb(Va) to be constant with respect to VDD, as further shown below with respect to FIGS. 6A–6B.

When data is being transmitted with a circuit such at FIG. 1, the clamp circuit performs two additional functions. First, it provides constant edge timing with varying bit widths. Typically, data will have varying bit widths. This can cause a problem when the voltage change at Va or Vb must have slow rise and fall times or slew rates. For example, if the fall time at Va needs to be 25% of the minimum bit width, the rise time to VDD (no clamp) at the gate of M5 might have to be greater than the minimum bit width in order to achieve this (the slow rise time is achievable by sizing the ratio of I1 to C1). This means that for a minimal width bit, a rising voltage at the gate of M5 will not go all the way to VDD while for wider bits the rising voltage at the gate of M5 will go higher or all the way to VDD. A higher voltage at the gate of M5(M6) means that this voltage will have to travel further on its way down (which means more time) to get to the threshold voltage of M5(M6). Thus, the timing of the rising edge at Va will vary between a minimal width bit and a wider bit. This phenomenon is shown in FIG. 6A.

Figure 6A:
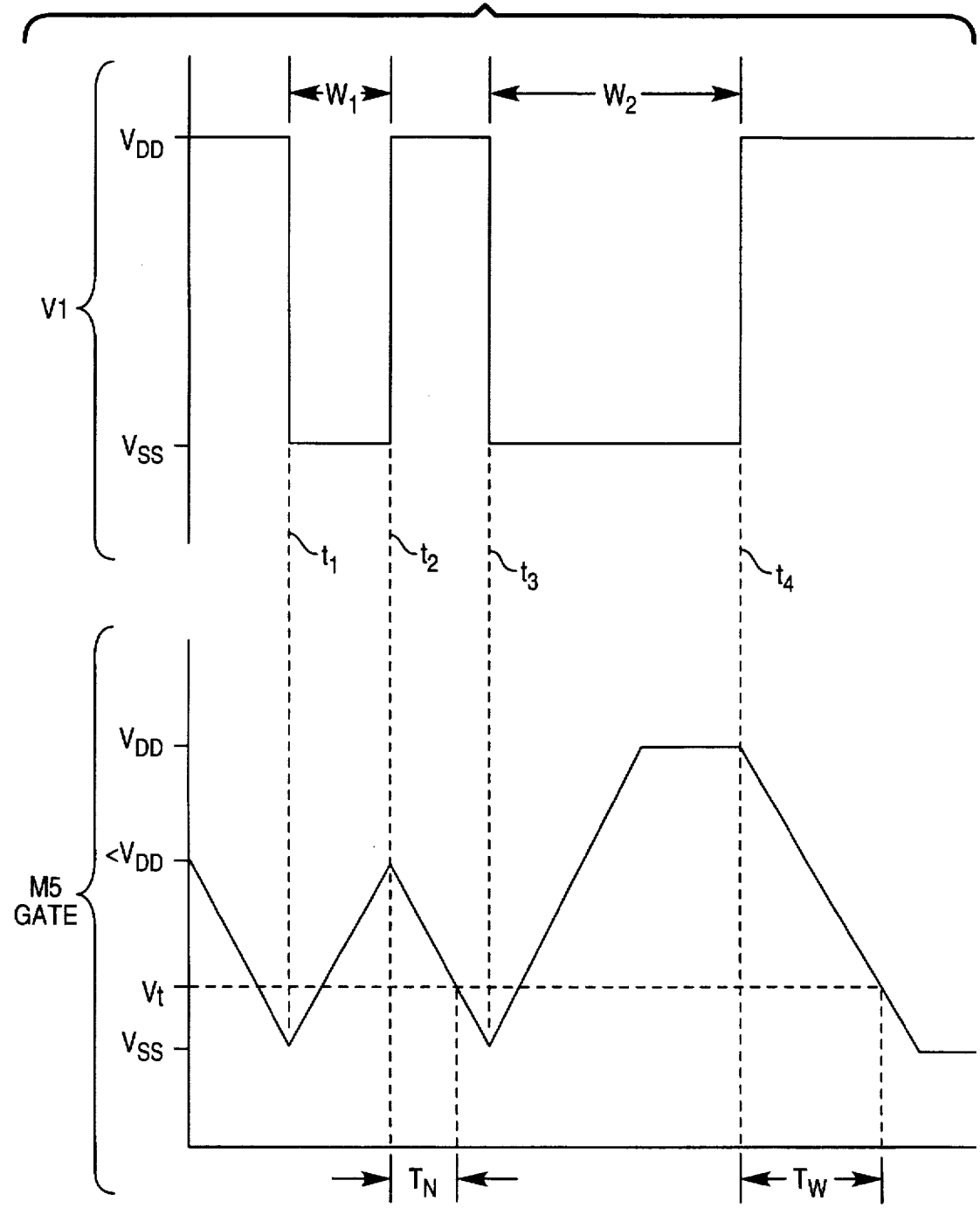
FIGS. 6A–6B are timing diagrams that show symmetric slew control.

FIG. 6A shows the voltage waveforms for input V1 and the gate of transistor M5, but without clamps CL1 and CL2 being present. At time t1, when V1 goes low (i.e. from VDD volts to VSS volts), the gate voltage of M5 begins rising from VSS toward VDD (stacked transistor pair M1/M3 operates as an inverter, and hence the gate voltage of M5 is inverted from that of the input voltage V1). However, due to the minimal symbol width W1, the M5 gate voltage doesn't have time to reach VDD before the input voltage V1 begins to go high at time t2. Rather, the M5 gate voltage begins going low at time t2, and never reaches VDD. This gate voltage eventually passes through the threshold voltage for M5, at which point transistor M5 turns on (M5 is a p-channel FET which turns on when the gate voltage is less than the threshold voltage). The time between the V1 input switching (at time t2) and the time of output driver M5 starting to turn on, for a minimal bit width W1, is shown in FIG. 6A as $T_N$. At time t3, a change in the input V1 to a low level causes the M5 gate voltage to begin rising toward VDD, as occurred at time t1. However, now the symbol width W2 is greater, and thus the gate voltage has time to increase all the way to the rail voltage VDD. Because the gate voltage is now at a higher voltage level, it will take longer for this voltage to decrease below the M5 threshold voltage when input V1 goes high at time t4. The time between the V1 input switching high (at time t4) and the time of output driver M5 starting to turn on, for a wide bit width W2, is shown in FIG. 6A as $T_W$. It is seen that $T_W > T_N$. Thus, the timing of the rising edge at Va varies between a minimal width bit and a wider bit.

Figure 6B:
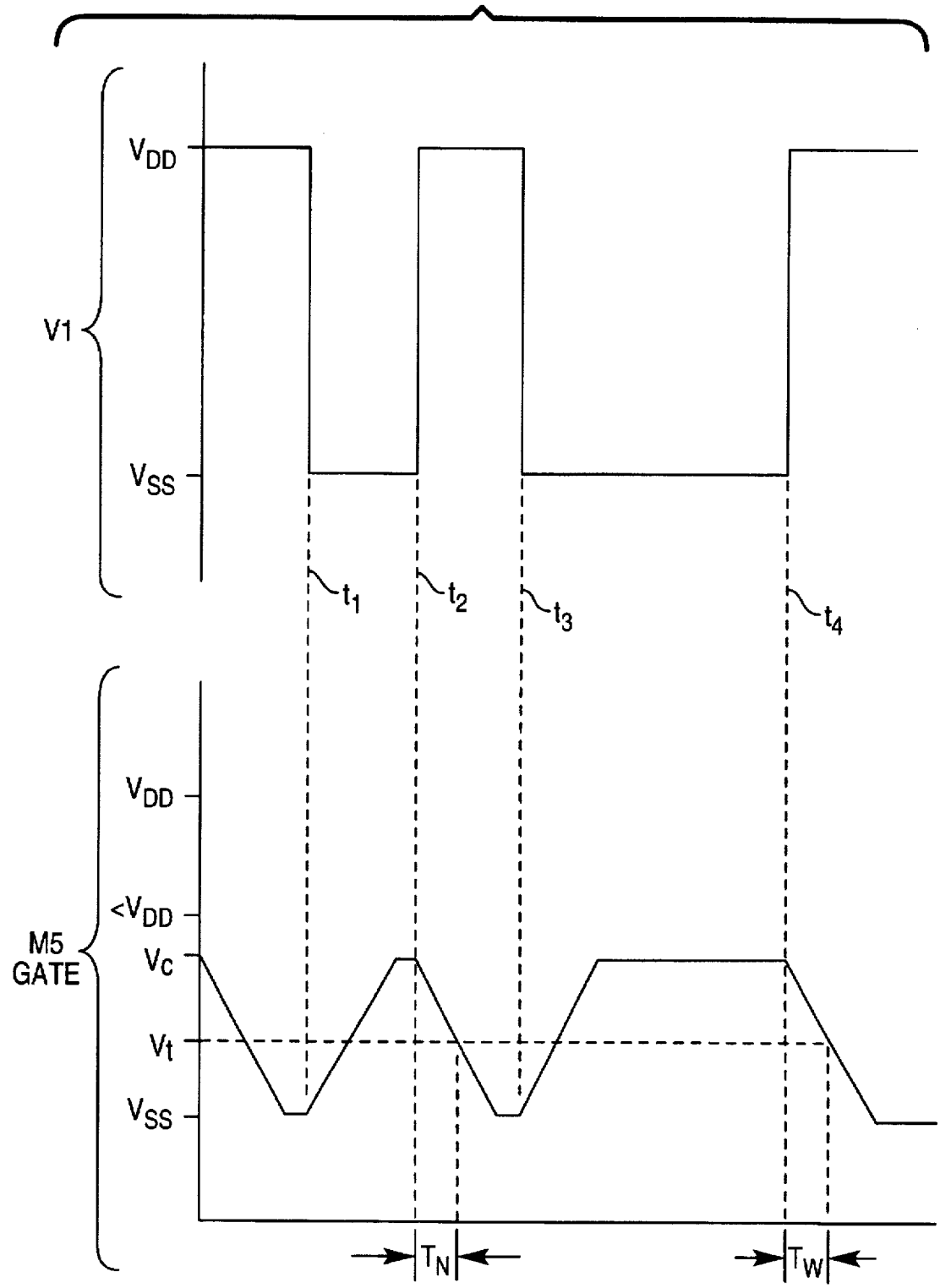

Referring now to FIG. 6B, the effects of utilizing the present invention described herein are shown. FIG. 6B shows the voltage waveform for input V1 and the gate of M5, where the gate of transistor M5 has a clamp CL1. At time t1, when V1 goes low, the gate voltage of M5 begins rising from VSS toward VDD. However, the clamp threshold value Vc is reached before the input voltage changes at time t2, and hence the M5 gate voltage reaches a maximum voltage of Vc prior to t2. At time t2, the input voltage V1 switches from low to high. The M5 gate voltage begins going low at time t2. This gate voltage eventually passes through the threshold voltage for M5, at which point transistor M5 starts to turn on. The time between the V1 input switching (at time t2) and the time of output driver M5 starting to turn on, for a minimal bit width W1, is shown in FIG. 6A as $T_N$. At time t3, a change in the input V1 to a low level causes the M5 gate voltage to begin rising toward VDD, as occurred at time t1. However, even though the bit width W2 is greater, and the gate voltage would have time to increase all the way to the rail voltage VDD, the gate voltage is clamped at Vc. Because the gate voltage is now at the same voltage level as it was for a minimal width bit, it will take the same amount of time for this voltage to decrease below the M5 threshold voltage. The time between the V1 input switching (at time t4) and the time of output driver M5 actually turning on, for a wide bit width W2, is shown in FIG. 6B as $T_W$ (defined herein to be a "symmetrical slew rate"). It is seen that $T_W=T_N$. Thus, the timing of the rising edge at Va does not vary between a minimal width bit and a wider bit. In addition, since the gate voltage is clamped at Vc, and never rises to VDD, the transition edges of the output signal Va (or Vb) are constant with respect to VDD.

A second additional function achieved by the present design is that it minimizes or eliminates charge storage effects leading to variations in transmit amplitude. During the transition from idle to actively transmitting, a circuit such as FIG. 1, but without the clamps CL1 and CL2, will have charge build up effects on the current source Is. These effects will change the magnitude of Is, and thus the transmit voltage amplitude, until a point of equilibrium is reached. With the clamps CL1 and CL2 included in the circuit of FIG. 1, a low impedance path to ground is provided for the gate to source capacitance of M5 and M6. This low impedance provides a discharge path for any charge build up on the current source Is, resulting in constant amplitude transmission for all time. Without the clamp, the charge build up on the current source would vary the magnitude of the current and hence the transmit voltage.

FIGS. 2–4 show alternate embodiments to the circuit of FIG. 1. FIG. 2 operates similar to FIG. 1, but the output stage is configured in a mirror-image fashion. Specifically, instead of clamping the gates of transistors M5 and M6 to ground, the gates of transistors M5 and M6 are clamped to VDD. Also, instead of providing a current source from VDD to the source nodes 14 and 16 of transistors M5 and M6, the current source Is is provided from ground to the source nodes of M5 and M6. This circuit operates in a similar, but opposite, manner to the circuit of FIG. 1.

FIG. 3 is a modification of the circuit of FIG. 1, and includes two stacked transistor pair output drivers M5/M7 and M6/M8. Transistors M5 and M7 have their respective gates commonly connected to one another, and coupled to the positive (+) terminal of clamp CL1. The drains of transistors M5 and M7 are also commonly connected to one another, with such connecting point being output node Va. In similar fashion, transistors M6 and M8 have their respective gates commonly connected to one another, and coupled to the positive (+) terminal of clamp CL2. The drains of transistors M6 and M8 are also commonly connected to one another, with such connecting point being output node Vb. Output nodes Va and Vb are coupled together through resistor R. The configuration of FIG. 3 allows for isolating the load R from either supply voltage (VDD or VSS). Otherwise, the techniques described above with respect to FIG. 1 (and the associated timing diagrams shown in FIGS. 6A–6B) apply to the circuit of FIG. 3.

FIG. 4 includes the changes of both FIG. 2 and FIG. 3. The circuit of FIG. 4 has been modified from that of FIG. 1 by both mirroring the current sources/output driver configurations as was done in FIG. 2, as well as including the two stack transistor pair driver circuits as was done in FIG. 3. The operation of FIG. 4 is similar to that of FIGS. 2 and 3, and need not be repeated.

Figure 5:
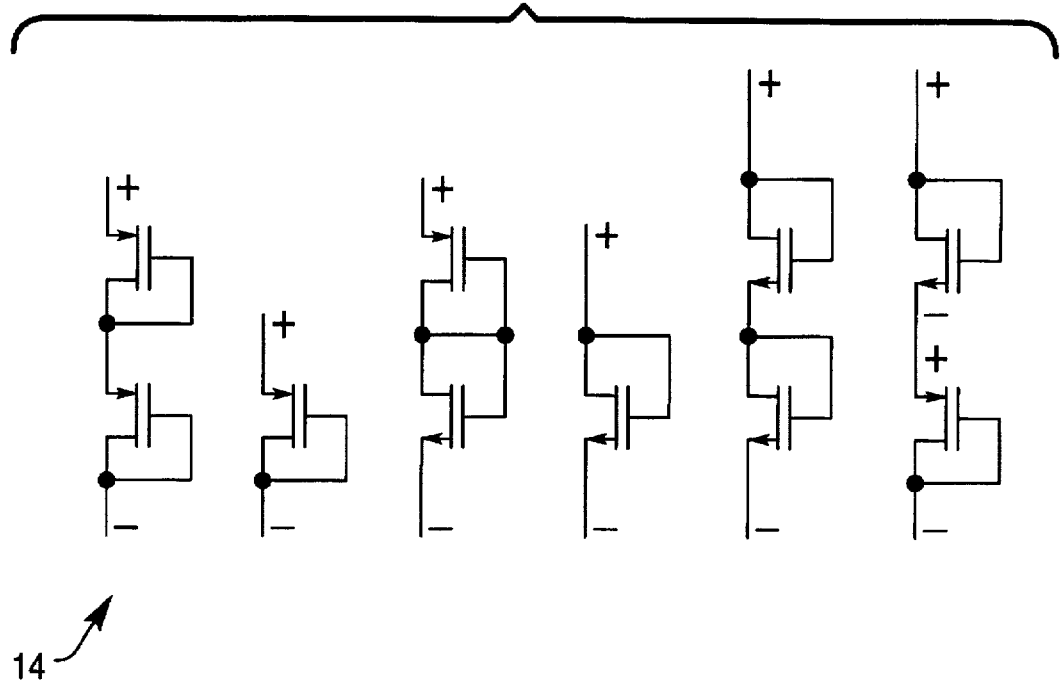
FIG. 5 shows various clamping circuits.

FIG. 5 shows various configurations for the clamps CL1 and CL2 shown in FIGS. 1–4. The preferred clamp comprises a plurality of transistors, configured as diodes, that are coupled in series, where the plurality of transistors comprise at least one p-channel device. The preferred configuration is shown in FIG. 5 on the far left side at 14, where two p-channel FET devices are each configured as a diode (with the gates directly coupled to the respective drains), with the diodes being serially connected together. The particular device sizes are process specific, and are chosen to yield an approximately 1.9 volt clamp voltage in the preferred embodiment.

Figure 7:
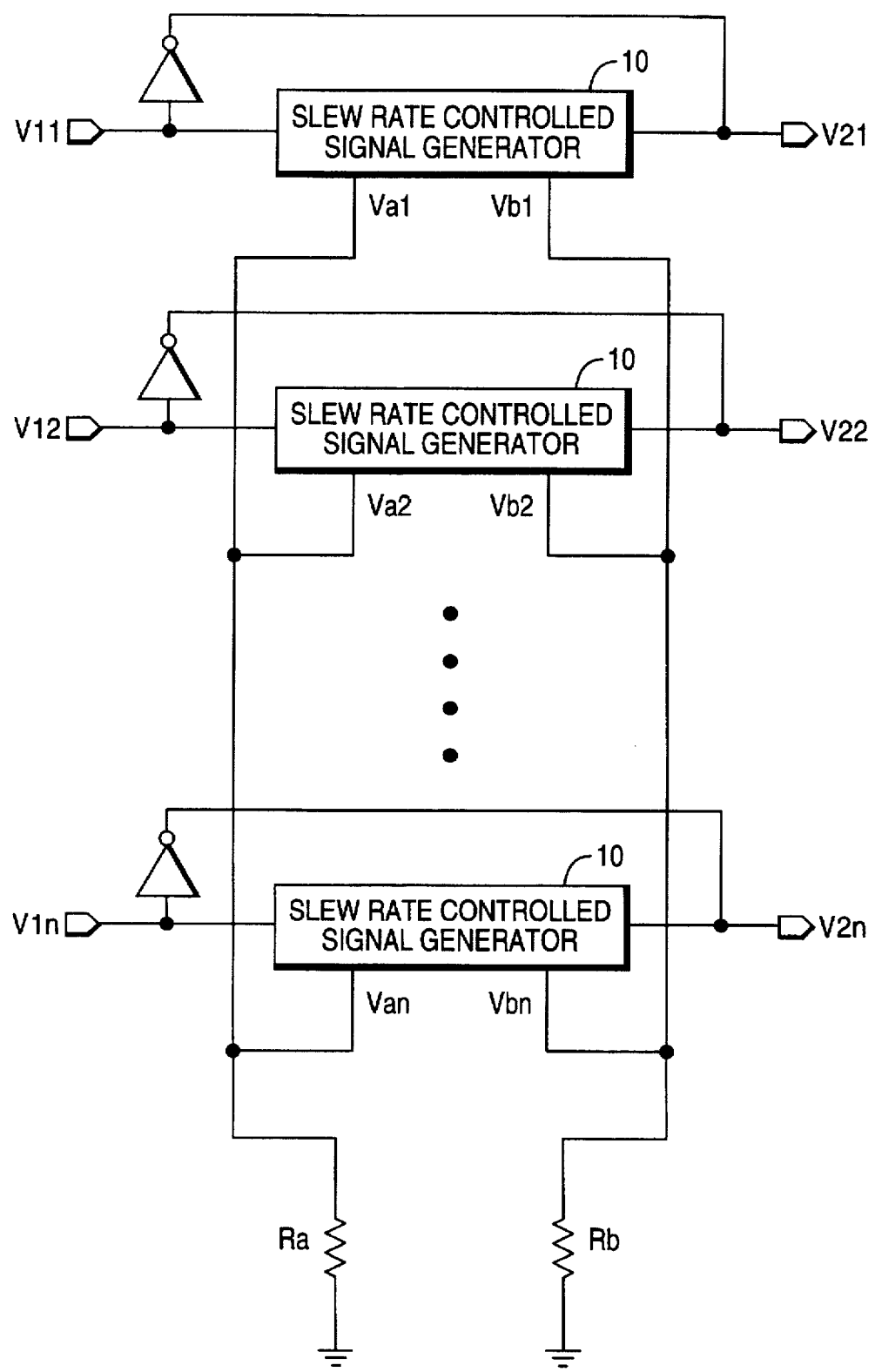
FIG. 7 shows a circuit where many differential current switches are summed together.

FIG. 7 shows a technique whereby a plurality of slew rate controlled signal generators are summed together. The current switches are turned on sequentially, via inputs V11/V21, V12, V22, . . . , V1n/V2n, in order to generate transition edges which are similar to a sine wave. Hence, the circuit of FIG. 7 functions as a D-to-A converter. The outputs Va1, Va2, . . . , Van are coupled together to generate an output voltage across resistor Ra, and outputs Vb1, Vb2, . . . , Vbn are coupled together to generate an output voltage across resistor Rb. This circuit provides more control over the shape of the edges, in that it allows for the generation of a sine wave with square wave inputs.

Figure 8:
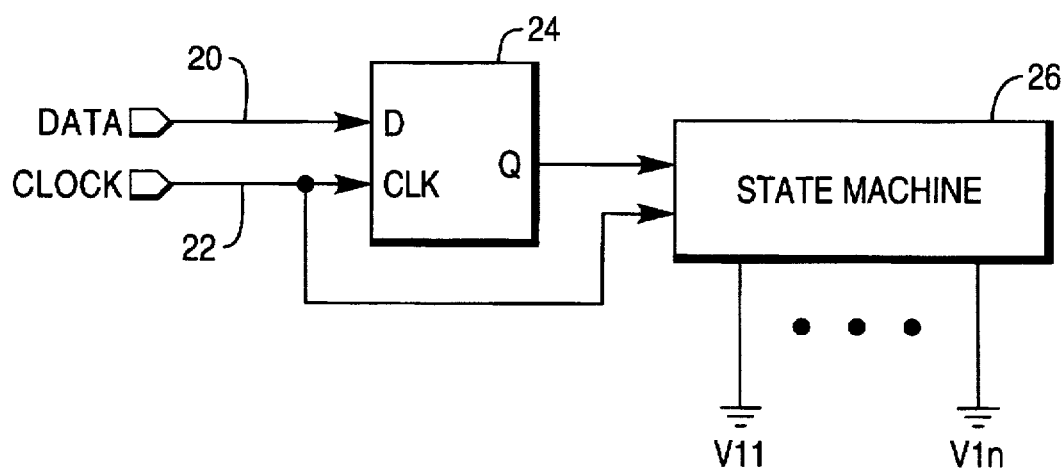
FIG. 8 is a control circuit for the summing circuit of FIG. 7.

FIG. 8 shows the control logic used to accomplish such sine wave generation. The data signal which is to be generated by the composite signal generator of FIG. 7 is provided at 20. A clock signal is provided at 22. In the preferred embodiment, the clock signal 22 is operating at a frequency which is N times greater than the frequency of the data signal 20. For example, if the data signal is a 1 Mhz signal, the clock signal is preferably 10 MHz. The data and clock signals feed into block 24, which is a clocked data flip-flop. The Q output of block 24, as well as the clock signal 22, is coupled to a state machine 26. The state machine has a plurality of outputs V11 . . . V1N, which are coupled to the Vii . . . V1N inputs of FIG. 7. The state machine 26 provides delayed sequencing of the data signal to the various individual signal generators 10 of FIG. 7. State machines for delayed sequencing are known in the art, and need not be further described herein. By sequencing the input signal to the plurality of signal generators, it is possible to generate a sine wave from a square wave data signal 20.

In summary, this invention solves three problems that we encountered in developing a driver that works at both three and five volts. The common mode energy of the transmit signal does not degrade with variations in supply voltage. The common mode energy of transmit signal does not degrade with variations in symbol width. Finally, the transmit level does not vary due to charge storage effects.

While we have illustrated and described the preferred embodiments of my invention, it is to be understood that we do not limit ourselves to the precise constructions herein disclosed, and the right is reserved to all changes and modifications coming within the scope of the invention as defined in the appended claims.

We claim:

1. A slew rate controlled driver circuit, comprising:

a supply voltage node;

an input for receiving an input signal; and means for generating an output signal, having a substantially symmetrical slew rate, from the input signal while operating the driver circuit with a supply voltage on the supply voltage node that changes greater than 10% from a nominal value.

2. The driver circuit of claim 1 wherein the supply voltage changes from about 3.3 volts to about 5.0 volts.

3. The driver circuit of claim 1 wherein the driver circuit is an Ethernet driver circuit.

4. The driver circuit of claim 1 wherein the driver circuit is a SCSI driver circuit.

5. A signal generator for transmitting a data signal received at an input thereof, comprising:

a transistor;

means for maintaining a constant voltage differential between a clamped input voltage of the transistor and a turn on voltage of the transistor during data transmission.

6. A signal generator, comprising:

an output driver;

a current switch for selectively enabling and disabling a current source, said current source coupled to said output driver; and a clamp coupled to an input of said output driver.

7. A signal generator, comprising:

a plurality of output drivers, each of said output drivers comprising a current switch for selectively enabling and disabling a current source; and a plurality of clamps, each of said clamps coupled to a respective input of one of said output drivers.

8. A circuit for transmitting data, comprising:

a current source; and means for switching current from the current source to a clamp based upon data to be transmitted, said clamp shunting at least a portion of said current during data transmission.

9. The circuit of claim 8 wherein a clamp voltage from the clamp is coupled to a current switch.

10. A circuit for transmitting a data signal received at an input thereof, comprising:

an output for transmitting an output signal; and means for generating a symmetrical slew rate output signal having a slew rate less than a slew rate of the input signal during data transmission.

11. A system for transmitting a data signal having varying pulse widths and received at an input thereof, comprising:

a supply voltage; and a signal generator comprising means for generating an output signal having a substantially symmetrical slew rate when said supply voltage changes between a plurality of substantially dissimilar supply voltages.

12. A method for operating a slew rate controlled driver circuit comprising a supply voltage node, said method comprising the steps of:

receiving an input signal; and generating an output signal, having a substantially symmetrical slew rate, from the input signal while operating the driver circuit with a supply voltage on the supply voltage node that changes greater than 10% from a nominal value.

13. A method for transmitting a data signal received at an input of a circuit having a transistor, comprising the step of:

maintaining a constant voltage differential between a clamped input voltage of the transistor and a turn on voltage of the transistor during data transmission.

14. A method for generating electrical signals, comprising the steps of:

while receiving an input signal to be transmitted, selectively enabling and disabling an output driver based upon the received input signal; and clamping an input of said output driver when enabled.

15. A method for generating electrical signals, comprising the step of:

receiving at least one input signal;

selectively enabling and disabling a plurality of output drivers based upon the received at least one input signal; and clamping an input of a respective one of said plurality of output drivers when such output driver is enabled.

16. A method for transmitting data, comprising the step of:

switching current from a current source to a clamp based upon data to be transmitted, said clamp shunting at least a portion of said current during data transmission.

17. The method of claim 16 further comprising the steps of:

generating an output transistor gate voltage from the switched current; and generating an output signal by said output transistor.

18. A method for transmitting data, comprising the step of:

receiving an input signal; and generating a symmetrical slew rate output signal from the input signal, said output signal having a slew rate less than a slew rate of the input signal during data transmission.

19. A method for operating a driver circuit that transmits a data signal having varying pulse widths and received at an input thereof, comprising the steps of:

generating a supply voltage; and generating an output signal having a substantially symmetrical slew rate when said supply voltage changes between a plurality of substantially dissimilar supply voltages.

20. A method for operating a slew rate controlled driver circuit, comprising the steps of:

receiving an input signal having a data rate of at least 10 Mbits/sec and varying pulse widths; and generating an output signal, having a substantially symmetrical slew rate, from the input signal.

* * * * *